United States Patent [19]

Kosa et al.

[11] 4,426,764

[45] Jan. 24, 1984

[54] SEMICONDUCTOR MEMORY DEVICE WITH PERIPHERAL CIRCUITS

[75] Inventors: Yasunobu Kosa, Kodaira; Shinji Shimizu, Koganei, both of Japan

[73] Assignee: Hitachi, Ltd., Tokyo, Japan

[21] Appl. No.: 241,539

[22] Filed: Mar. 9, 1981

Related U.S. Application Data

[63] Continuation of Ser. No. 891,030, Mar. 28, 1978, abandoned.

[30] Foreign Application Priority Data

Apr. 6, 1977 [JP] Japan .................................. 52-38528

[51] Int. Cl.³ ........................................... H01L 21/22
[52] U.S. Cl. ....................................... 29/571; 29/578;
29/577 C; 29/591; 148/187
[58] Field of Search ............. 29/571, 578, 591, 577 C;
148/187

[56] References Cited

U.S. PATENT DOCUMENTS

| | | | |
|---|---|---|---|
| 3,868,187 | 2/1975 | Masuoka | 357/23 |
| 3,899,373 | 8/1975 | Antipov | 29/571 X |
| 3,984,822 | 10/1976 | Simko et al. | 29/571 X |
| 4,112,507 | 9/1978 | White et al. | 29/571 X |
| 4,115,914 | 9/1978 | Harari | 29/571 |
| 4,151,021 | 4/1979 | McElroy | 148/187 |

FOREIGN PATENT DOCUMENTS 2445030 4/1976 Fed. Rep. of Germany .
2716691 12/1977 Fed. Rep. of Germany .

*Primary Examiner*—G. Ozaki
*Attorney, Agent, or Firm*—Antonelli, Terry & Wands

[57] ABSTRACT

A semiconductor memory device and a method of manufacturing the device wherein a field insulation is formed in a surface of a semiconductor body except for the source, drain and channel regions, a first floating gate is self-aligned to the channel region, a second gate insulated from the first floating gate covers the first floating gate and the first insulator having a width substantially same as the length of the channel region between the source and the drain regions.

23 Claims, 34 Drawing Figures

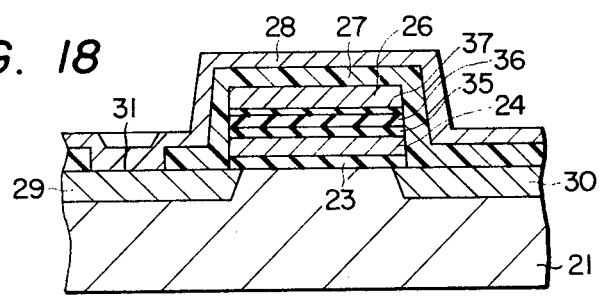
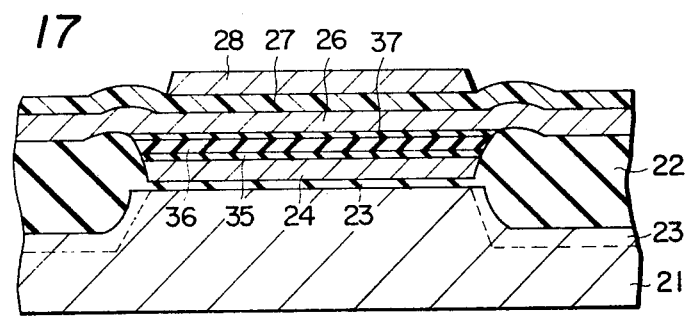
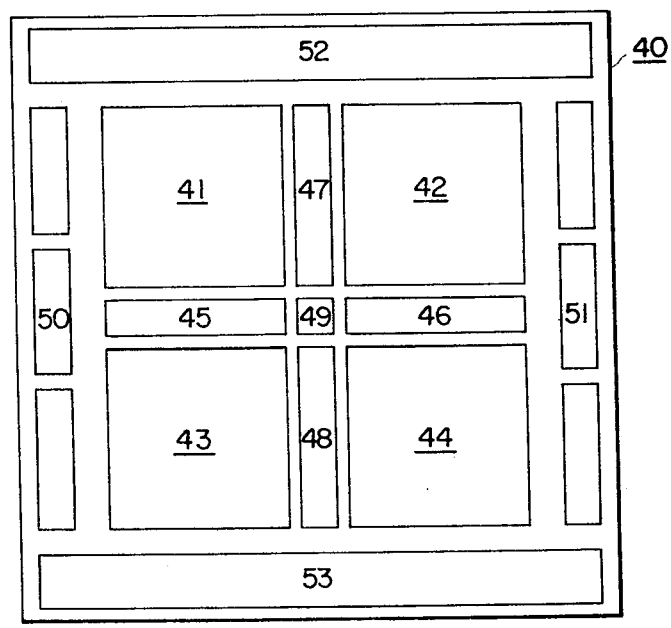

SEMICONDUCTOR MEMORY DEVICE WITH PERIPHERAL CIRCUITS

This is a continuation of application Ser. No. 891,030, filed Mar. 28, 1978, now abandoned.

List of Prior Art (37CFR 1.56(a))

The following references are cited to show the state of the prior art:
(1) J. Barnes et al, "Operation and Characterization of N-channel EPROM cells", Technical Digest 1976 International Electron Device Meeting, Dec. 6, 7 and 8, 1976, pp. 173 to 176.
(2) V. L. Rideout et al. "MOSFETs with Polysilicon Gates Self-aligned to the Field Isolation and to the Source/Drain Regions", Technical Digest 1976 International Electron Devices Meeting, Dec. 6, 7, and 8, 1976, pp. 593 to 596.
(3) Frohman-Bentchkowsky, U.S. Pat. No. 3,660,819, May 1972.
(4) Dawson Kahng, U.S. Pat. No. 3,500,142, March 1970.

BACKGROUND OF THE INVENTION

The present invention relates to an insulated gate type field effect transistor and, more particularly, to a non-volatile semiconductive memory device having a floating polysilicon layer, as well as to a method of manufacturing the device.

In the past, various types of electrically programable read only memory device making use of MOS (metal oxide semiconductor) elements have been proposed.

Among these proposed read only memory devices, a device called EPROM (Electrically Programmable Read Only Memory) of nMOS type, manufactured by a double polysilicon layer technique and having a floating type first (underlying) polysilicon layer acting as an electric-charge accumulation layer, is most popular.

As a result of current demand for increased numbers of circuit elements integrated on a single semiconductive substrate, it is becoming a matter of significance to make each memory cell, which constitutes the unit of memory function in semiconductive chips having the ROM of the kind described, as small as possible.

At the same time, it is to be pointed out that the process for manufacturing these semiconductive devices is inevitably rendered complicated, as the density of the integration is increased.

BRIEF SUMMARY OF THE INVENTION

It is therefore an object of the invention to provide an improved insulated gate type field effect transistor.

It is another object of the invention to provide an electrically programmable read only memory of reduced size of cells.

It is still another object of the invention to provide a simple construction of double polysilicon layer type electrically programmable read only memory having a good reproducibility.

It is a further object of the invention to provide an improved technique suitable for manufacturing electrically programmable read only memories of increased density of integration.

It is still another object of the invention to provide a method of manufacturing memory cells of electrically programmable read only memory, consisting of a simplified manufacturing process.

To these ends, according to the invention, there is provided a semiconductor device having a substrate including a source and a drain region, a first floating gate formed on said substrate through a first insulating film, a second control gate formed on the first floating gate through a second insulating film, and a field insulator formed on the field region of the substrate, wherein the floating gate and the control gate do not substantially overlap the source and drain regions, and the floating gate does not overlap the field insulator formed on the field region.

These and other objects, as well as advantageous features of the invention will become clear from the following description of the preferred embodiments taken in conjunction with the accompanying drawings.

BRIEF DESCRIPTION OF THE DRAWINGS

FIGS. 17 and 18 are sectional views of essential parts of different embodiments in accordance with the invention, FIG. 19 is a schematic illustration of a planar pattern of a semiconductor chip for an electrically programmable read only memory device in accordance with the invention.

DESCRIPTION OF THE PREFERRED EMBODIMENTS

Before turning to the description of the preferred embodiments, an explanation will be made as to the theoretical construction of floating type memory cell, with specific reference to FIGS. 1 to 3.

Figure 1:
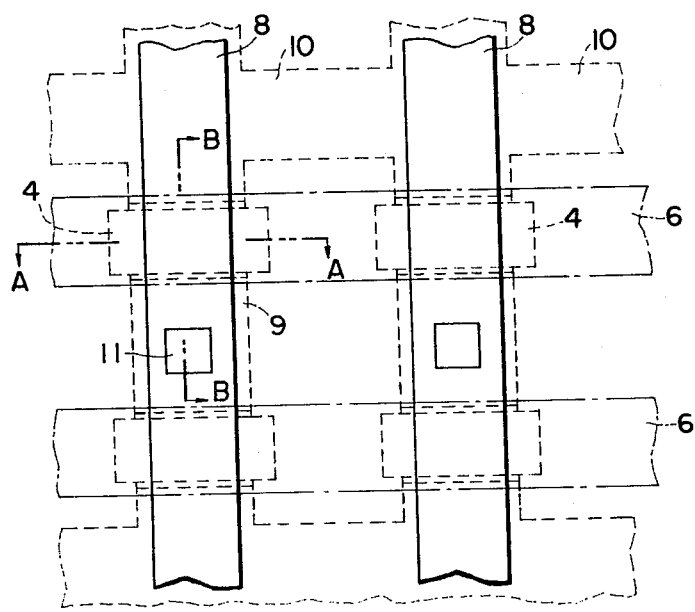
FIG. 1 is a plan view of a floating type memory cell, drafted for an easier understanding of the principle and basic construction of the same.
Figure 2:
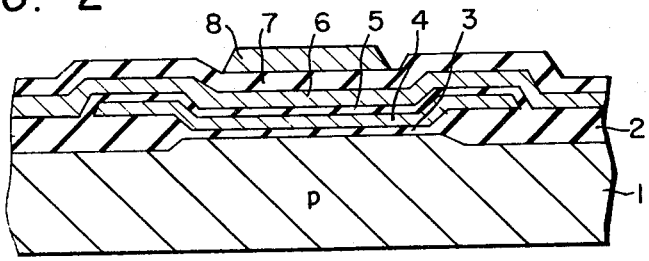
FIG. 2 is a sectional view taken along the line A—A of FIG. 1.

Referring first to FIG. 1 showing the plan of the memory cell and to FIG. 2 showing the section taken along the line A—A of FIG. 1, reference numeral 1 denotes a P type silicon substrate, while reference numeral 2 designates a field oxidized film obtained by a selective oxidation. Reference numerals 3, 4 and 5 denote, respectively, a first insulated gate film (SiO$_2$), first floating polysilicon film and a second insulated gate film. A second polysilicon film which constitutes a control gate, and an intermediate insulating layer such as PSG are designated at numerals 6 and 7, respectively. Reference numeral 8 denotes an aluminum wiring layer.

Figure 3:
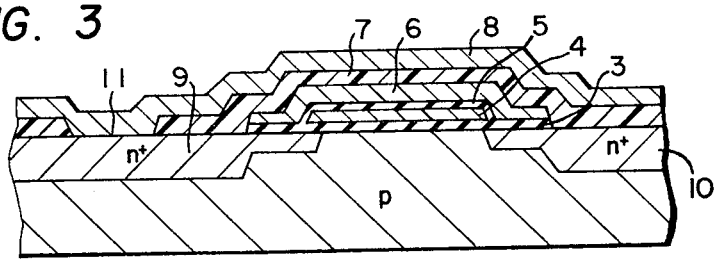
FIG. 3 is a sectional view taken along the line B—B of FIG. 1.

Referring now to FIG. 3 showing the section of the cell taken along the line B—B of FIG. 1, reference numerals 9 and 10 denotes n+ type diffusion layers constituting a drain and a source region, respectively, while a contact area of the wiring layer is designated at numeral 11. In the above stated memory cell, the field oxidized film 2 is formed by a selective oxidation employing a mask of Si$_3$N$_4$ selectively covering the active region.

As will be seen from FIGS. 1 through 3, the first polysilicon layer 4, which is a floating gate, overlaps the field oxidized film 2, while the second polysilicon layer 6 overlaps the first polysilicon layer 4. These overlaps are formed by means of a photoresist mask which, for effecting these overlaps, has to have a dimensional margin of 2 to 5 microns, inconveniently resulting in an enlarged size of the cell.

It is also to be pointed out that the FAMOS (Floating Avalanche MOS) memory cell of the kind described can be manufactured only through an extremely complicated manufacturing process.

More specifically, according to the most popular way of manufacturing, the first gate oxidized film 3 is formed on the active region of the Si substrate, after forming the field oxidized film 2 on a part of the surface of the substrate 1. Then, the first polysilicon film 4, which constitutes the floating gate is formed on the first gate oxidized film 3. Subsequently, the floating gate pattern is formed by means of a photoetching. Then, the Si substrate and the polysilicon layer are doped with impurities, by means of an ion driving or heat diffusion technique making use of a mask of polysilicon, so as to form the second gate oxidized film 5. Then, the second polysilicon layer is formed by CVD (Chemical Vapor Deposition) method. Subsequently, a photoetching is carried out with such a pattern that the first polysilicon layer is completely covered with the second polysilicon layer, and the doping with the impurities is carried out again.

As a result of above stated complicated process having a number of steps, the cost of manufacture of the memory cell is rendered considerably high.

Figure 4:
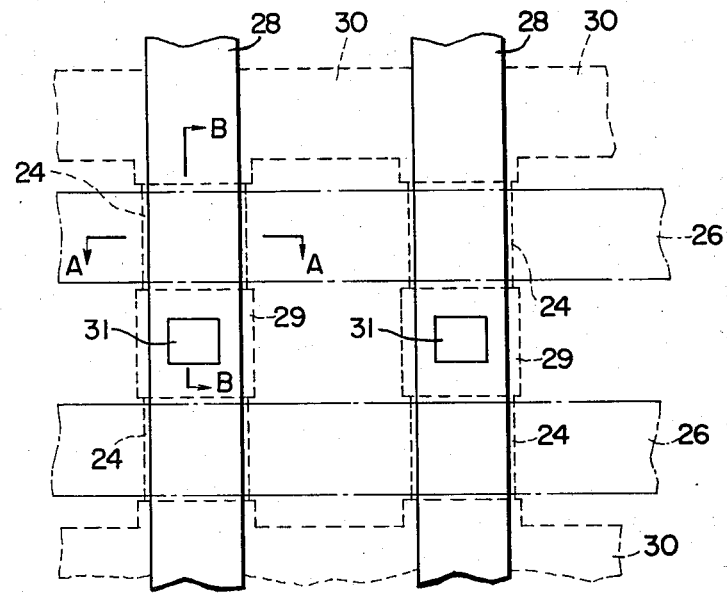
FIG. 4 is a plan view showing the basic construction of a floating memory section of a memory device in accordance with the invention.
Figure 5:
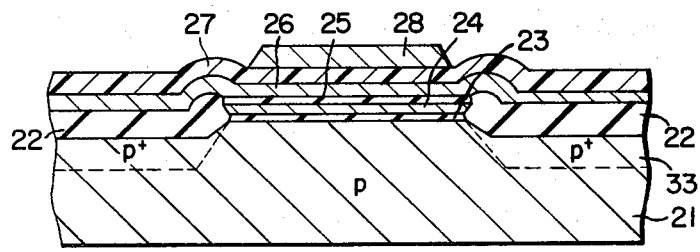
FIG. 5 is a sectional view taken along the line A—A of FIG. 4.
Figure 6:
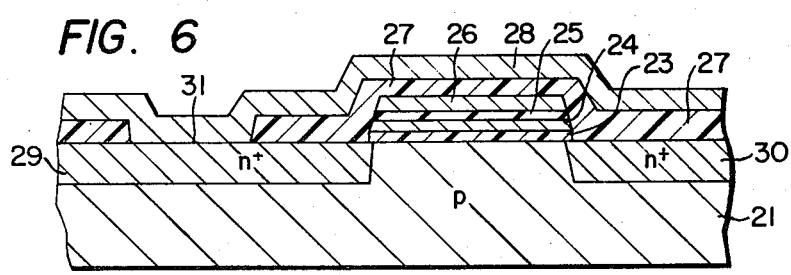
FIG. 6 is a sectional view taken along the line B—B of FIG. 4, FIGS. 7 to 10 are sectional views corresponding to that taken along the line A—A of FIG 4, in respective steps of the process in accordance with the invention for manufacturing the floating type memory cell.

Under these circumstances, the present inventors have succeeded in obtaining an improved construction of memory cell as shown in FIGS. 4 thru 6, making a positive use of self-aligning formation of the first polysilicon layer which constitutes the floating gate with the second polysilicon layer which constitutes the control gate and the wiring layer, as well as a self-aligning formation of the first polysilicon layer which constitutes the floating gate with the field SiO$_2$ film.

Hereinafter, a preferred embodiment of the invention will be described with specific reference to FIGS. 4 thru 6. As will be seen from these Figures, in the memory cell and the electrically programmable read only memory device of this embodiment, a plurality of insulated gate type field effect transistors, each having an N type source region 30 and a drain region 29, are formed on a P type semiconductor substrate 21, so as to form respective memory cells. The opposite side surfaces of a channel region between the source and the drain regions 30, 29 are terminated by a thick isolation 22 such as, for example, a field oxide film made of silicon oxide. At the same time, a metallic layer which constitutes the first floating gate electrode, such as a polysilicon layer 24 is formed only just above the channel area defined as above, with a thin gate insulating film 23 interposed therebetween, so as to have an area substantially equal to that of the channel region. Thus, the layer 24 is not extended to lie over the thick field oxide film 22.

A second metallic layer such as a polysilicon layer 26 is formed just above the first polysilicon layer 24 constituting the aforementioned floating gate, with an interlayer insulating film 25 such as a silicon nitride film interposed therebetween. The second polysilicon layer 26 is extended to lie partially over the field oxide film 22 located at a side of the channel area. This second polysilicon layer 26 also self-aligns with the channel area between the source and the drain regions 30, 29, so as to extend just above the channel area transversely of the same.

A wiring layer 28 made of a metallic material such as aluminum is formed across the second polysilicon layer 26, with a second insulating film 27 such as of phosphosilicate-glass interposed therebetween, and is connected to the drain region 30 through a window 31 formed in the insulating film 27.

Thus, in the electrically programmable read only memory device of the invention, the first floating polysilicon gate 24 is disposed on the channel region sandwiched between the source and drain regions and having side surfaces terminated by relatively thick field oxide film, so as to have substantially the same dimension as the channel area. At the same time, a second polysilicon layer 26 is disposed to have a width substantially equal to the length of the channel area and to extend at a right angle to the channel just above and across the same. In other words, in the memory cell of the embodiment under description, the boundaries of the first floating gate electrode 24, the first inter-layer insulating film 25, the second gate electrode 26 and the source and drain regions defining the channel area are self-aligned to one another, while the field oxide film 22 is self-aligned to the first floating gate electrode 24 and to the source and drain regions.

In FIGS. 4 thru 6 inclusive, reference numeral 33 denotes a semiconductive region of the same conductivity type as the semiconductive substrate 21 and formed on the latter to lie under the thick field oxide film 22. This semiconductive region 33 is provided to prevent a generation of a parasitic channel on the surface of the substrate attributable to an application of voltage to the second polysilicon layer (control gate line) 26. At the same time, as will be seen also from these Figures, this semiconductive layer 33 is also formed just beneath the field oxide film 22 in self-alignment with the latter.

A so-called EPROM (electrically programmable read only memory) is constituted by a plurality of memory cells in accordance with the invention regularly arrayed in two orthogonal directions as a matrix. FIG. 4 shows a part of the electrically programmable read only memory in accordance with the invention. Only four memory cells are shown for clarifying the drawings.

As will be understood from the following detailed description of process for manufacturing the memory cell and the electrically programmable read only memory in accordance with the invention, as well as from FIGS. 4 to 6 inclusive, the first polysilicon layer (floating gate) 24 does not overlap the thick field oxide film 22, because they are formed in self-alignment. At the same time, as will be most clearly seen from FIG. 6, the edges of the first polysilicon layer 24 and the second polysilicon layer 26 are formed through a photoetching by means of the same photomask, so that no margin of mask alignment is required. Consequently, the size of cells can conveniently be reduced by 40%, as compared with that as shown in FIGS. 1 to 3, provided that the working precisions are equal.

FIGS. 7 to 16 show major steps of a process for manufacturing a FAMOS memory in accordance with the invention. Although the following description is made exemplarily as to the manufacture of n-channel type FAMOS, it is to be noted that the invention is never restricted to the n-channel type memory.

More specifically, FIGS. 7 to 10 show the steps for obtaining the construction as shown in FIG. 5, in section taken along the line A—A, while FIGS. 11 to 16 show the steps for obtaining the construction as shown in FIG. 6, in section taken along the line B—B of FIG. 4.

Figure 7:
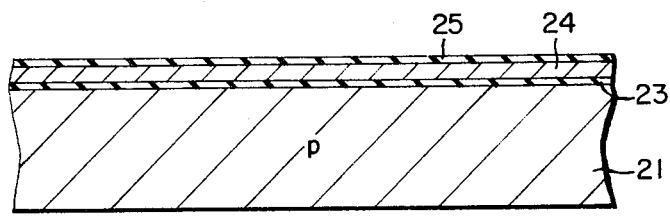
Figure 11:
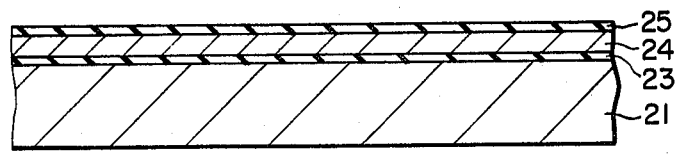
FIGS. 11 to 16 are sectional views corresponding to that taken along the line B—B of FIG. 4, in respective steps of the process in accordance with the invention for manufacturing the floating type memory cell.

(1) At first, Si monocrystal wafer (substrate) 21 of a specific resistance of 5 to 8 $\Omega$cm and having a (100) crystal surface of P conductive type is prepared. After suitably cleaning the wafer 21, the first gate oxide film 23 ($SiO_2$) is formed to have a thickness of, for example, 1000 Å, as shown in FIGS. 7 and 11. This can be performed by, for example, heat-treating the wafer 21 at a temperature of 1000° C. for 165 minutes, in an atmosphere of dry $O_2$. Immediately after the formation of this film 23, the first polysilicon film 24, which constitutes the floating gate, is formed on the oxide film 23.

In conventional Si gate process, the polysilicon layer functions not only as the gate electrode but as the wiring layer as well. Therefore, it has been necessary to make the polysilicon layer have a relatively large thickness of 0.3 to 0.6 microns, and to effect the doping with impurities at a high concentration, so as to reduce the surface specific resistance as much as possible.

However, in the FAMOS memory in accordance with the invention, the floating gate is intended for spreading and holding the injected charges, so that the lowered specific surface resistance is not always essential. Thus, the thickness of the first polysilicon layer 24 may be as small as 0.1 to 0.4 micron, preferably 0.1 to 0.2 micron. At the same time, the doping with the impurities may not be performed at a high concentration, and such a low surface specific resistance as 100 $\Omega$ to 100 K$\Omega$/cm$^2$ as could be obtained by a simple doped poly Si method is sufficient. Alternatively, the doping in this step can completely be omitted from this step of process, because a sufficient amount of impurities are doped to ensure the required memory characteristic of FAMOS, during the later-performed diffusion step for forming the source/drain and second gate, due to a side diffusion.

After the formation of the first polysilicon layer 24, an $Si_3N_4$ film 25, which functions as the mask for the selective oxidation and as the insulating inter-layer between the first and the second polysilicon layers, is formed to have a thickness of 0.07 to 2.20 micron, preferably 0.10 to 0.15 micron.

Figure 8:
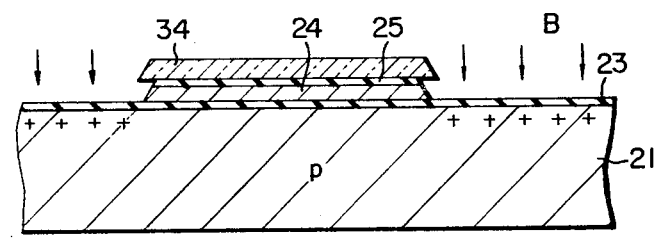
Figure 12:
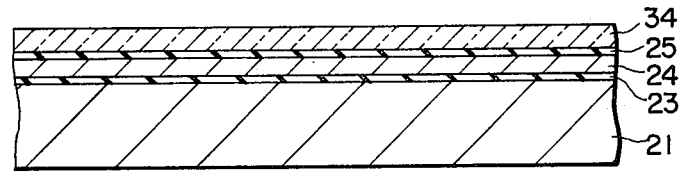

(2) Subsequently, the active region consisting of the channel, source and drain regions is covered with a photoresist film 34, as shown in FIGS. 8 and 12, and the portions of the $Si_3N_4$ film and of the first polysilicon layer 24 are removed through a plasma etching making use of, for example, $CF_4 + O_2$. Then, for the purpose of enhancing the threshold of the field $SiO_2$ section, boron ions are driven through the oxide film 23 exposed in the surface of the substrate, at a rate of, for example, $5 \times 10^{13}$ cm$^{-2}$ at 75 KeV. The photoresist film 34 is suitably removed after the ion driving.

Figure 9:
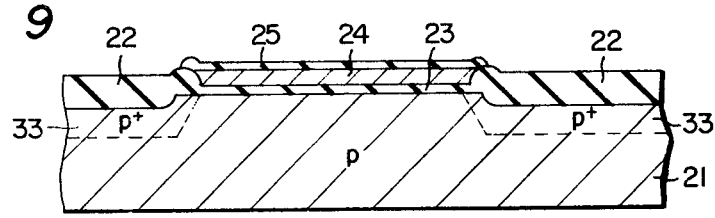
Figure 13:
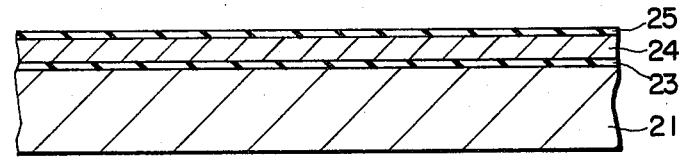

(3) Then, as shown in FIG. 9 and FIG. 13, a field $SiO_2$ film 22 of a thickness of 1.0 to 1.5 micron is formed on the portion of the substrate surface where the $Si_3N_4$ film 25 and the first polysilicon layer 24 have been removed, by a heat oxidation method making use of the $Si_3N_4$ film as a mask. This can be performed by heat treating the substrate in an atmosphere of wet $O_2$ or steam for 6 to 18 hours. During this heat treating, the $Si_3N_4$ film is oxidized to the depth of 200 to 500 Å. However, this depth is negligibly small as compared with the whole thickness of the field $SiO_2$ film 22 and, therefore, has been neglected from the drawings, for the clarification of the latter. As a result of the above stated heat treatment, the boron ions driven into the region under the $SiO_2$ film 22 are diffused through the Si substrate to form a P+ diffusion layer 33.

Figure 10:
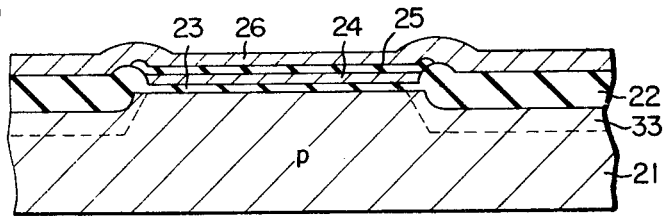
Figure 14:
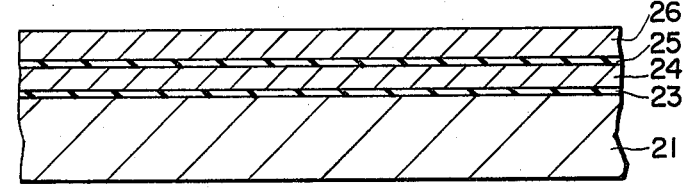

(4) As a subsequent step, as shown in FIGS. 10 and 14, the second polysilicon layer 26 is deposited over the entire surface, without removing the $Si_3N_4$ film 25 on the first polysilicon layer 24 and the $SiO_2$ film (not shown) on the $Si_3N_4$ film 25.

Figure 15:
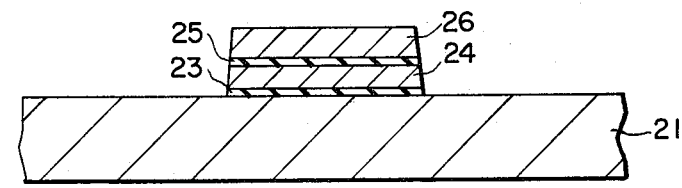

(5) Then, the control gate and the polysilicon wiring layer are formed by a photoetching. As will be seen from FIG. 15, the etching is effected on the second polysilicon layer 26, insulating interlayer 25, first polysilicon layer 24 and the first insulating layer 23, by means of the same mask. Since three or four layers are photoetched by the same mask, the control gate 26 and the floating gate 24 are formed in self-alignment, as shown in FIG. 15.

Figure 16:
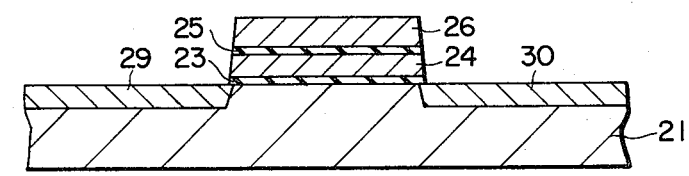

(6) After the completion of the photoetching, the exposed substrate surface and the polysilicon layer 26 are doped with impurities of the opposite conductive type to the substrate, e.g., phosphorus (P) and arsenic (As), by means of, for example, a heat diffusion method. As a result of this doping, N-type source region 30 and drain region 29 are formed as shown in FIG. 16.

(7) Subsequent steps are same as those of the conventional process for manufacturing the Si gate MOSIC. Namely, a PSG (phosphorus silicate glass) film 27, which constitutes an insulation layer between the Al wiring 28 and the polysilicon layer 26, is formed by CVD (chemical vapor deposition) method, as shown in FIGS. 5 and 6. Then, a photoetching is effected to form the contact window 31. Finally, the Al wiring 28 is formed by means of Al evaporation film.

The aforementioned objects of the invention can be achieved by the above described embodiment, as will be understood from the following description.

(1) The first polysilicon layer 24 which constitutes the floating gate and the field $SiO_2$ film 22 are formed in self-alignment, because the field $SiO_2$ film 22 is formed making the $Si_3N_4$ film on the first polysilicon layer 24 as the mask.

(2) The first and the second polysilicon layers 24,26 are formed in complete self-alignment, because the first layer 24, the insulating-interlayer 25 and the second layer 26 of the memory cell section are formed by a simultaneous etching.

(3) The constituents of the memory section are completely self-aligned by a relatively simple process, so as to provide a construction of minimized size.

(4) A relatively thick field oxide film is formed on the surface of the semiconductive substrate surface, making use of the silicon nitride film as a mask. Consequently, the multi-layered wiring in the memory cell section is rather flattened.

In the foregoing embodiment, the insulating interlayer 25 between the first polysilicon layer 24 and the second polysilicon layer 26 is constituted by the silicon nitride film. However, in order to minimize the strain caused in the first polysilicon layer by the difference of coefficients of thermal expansion, the first step (1) of the foregoing embodiment is preferably modified such that the $Si_3N_4$ film 25 is formed on an extremely thin heat-oxidized film ($SiO_2$) film of a thickness of 0.01 to 0.1 micron, after forming the extremely thin film on the surface of the first polysilicon layer 24.

As stated before in relation with the step (3) of the process of the embodiment, a thin silicon oxide film of thickness of 200 to 500 Å is formed on the surface of the $Si_3N_4$ film, during the selective oxidation of the substrate employing the mask of $Si_3N_4$. This silicon oxide film may be positively utilized to form a memory cell construction as shown in FIGS. 17 and 18. FIGS. 17 and 18 correspond, respectively, to the sectional views as shown in FIGS. 5 and 6. In these Figures, reference numerals 35 and 37 denote, respectively, the silicon oxide film of 100 to 1000 Å and the silicon oxide film of 200 to 500 Å. The silicon nitride film sandwiched by these silicon oxide films is denoted by reference numeral 36. By adopting this construction to avoid the direct contact of the silicon nitride film with the gate electrode, i.e., when the silicon nitride film is formed through a medium of the silicon oxide film, it is conveniently avoided that the carrier charged to the gate electrode in accordance with the wiring operation is trapped by the silicon nitride film, so that the lowering of the potential of the gate electrode can be diminished. Namely, the above mentioned two silicon oxide films function as stoppers against the trapping of the carrier, so as to provide a desirable electric characteristics in memory devices such as the non-volatile semiconductive memory in accordance with the invention.

At the same time, instead of forming the insulating interlayer 25 of silicon nitride film, the step (4) of the process of the foregoing embodiment may be modified such that the $Si_3N_4$ film and the $SiO_2$ film on the first polysilicon film 24 are removed and a heat oxidized ($SiO_2$) film of 1000 to 2000 Å is formed instead. The second polysilicon layer 26 is formed on this newly formed $SiO_2$ film. However, in this case, the thickness of the $SiO_2$ film must be as small as possible, because the electrostatic capacitance between two gate electrodes is made small due to the dielectric constant of $SiC_2$ smaller than that of $Si_3N_4$.

The so-called memory cell matrix or mat as shown in FIG. 4 having a number of memory cells arrayed in columns and rows is produced by the above described process.

In practically mounting an electrically programmable read only memory on a single silicon semiconductor chip, as shown, for example, in FIG. 19 schematically illstrating the pattern on the chip, the aforementioned memory cell mats 41, 42, 43, 44 are mounted on the semiconductor chip 40. At the same time, peripheral circuits electrically connected to these mats, e.g., sense-amp. circuit sections 45, 46; X decoder circuit sections 47, 48; Y decoder circuit section 49; input buffer circuit sections 50, 51; input/output circuit sections 52, 53 and so forth are arranged around these memory cell mats.

These peripheral circuits are constituted by insulating gate type semiconductor elements, similarly to the formation of the memory mats. Thus, according to the invention, these peripheral circuits can conveniently be mounted on the same semiconductor substrate as the memory mats, simultaneously with the formation of the latter, by making use of the above described process without substantially changing the same.

Figure 20:
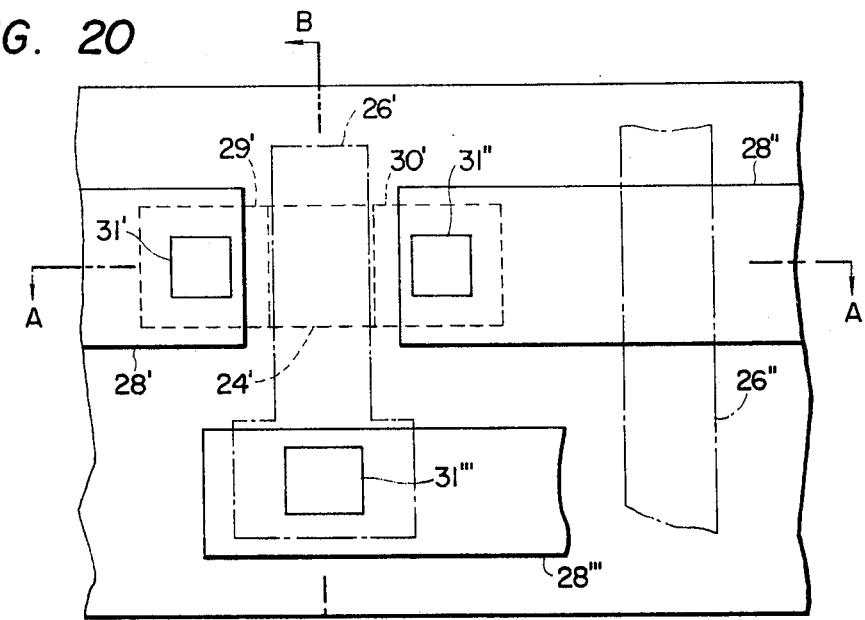
FIG. 20 is a plan view of a metal-oxide-semiconductor field effect transistor which constitutes the peripheral circuit portion other than the memory cell mats, formed in the chip as shown in FIG. 19.
Figure 21:
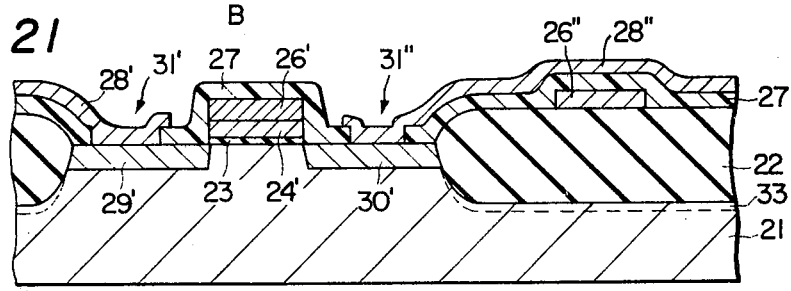
FIG. 21 is a sectional view taken along the line A—A of FIG. 2C.
Figure 22:
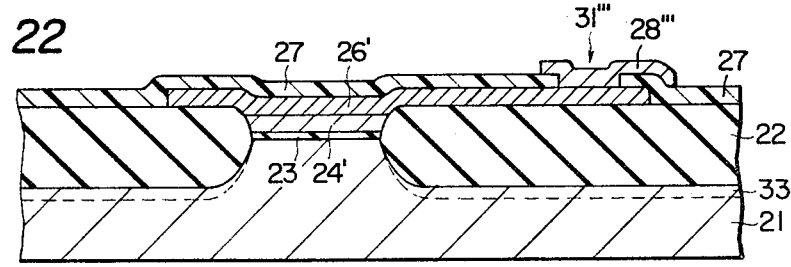
FIG. 22 is a sectional view taken along the line B—B of FIG. 20, and FIGS. 23 to 28 and FIGS. 29 to 34 are sectional views of elements corresponding to those of FIG. 21 and FIG. 22, in respective steps of process for manufacturing the element.
Figure 23:
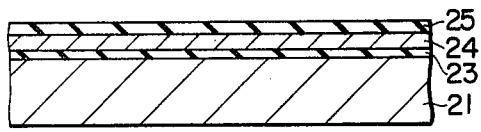
Figure 24:
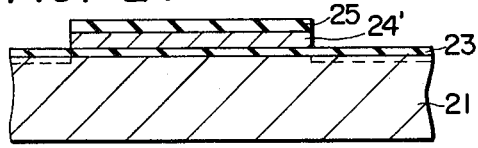
Figure 25:
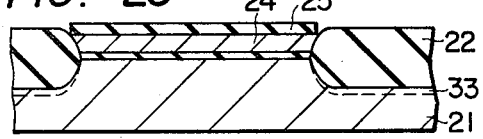
Figure 26:
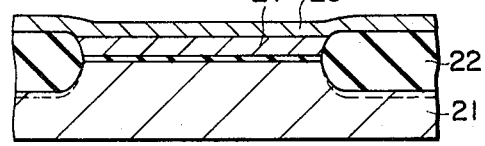

By way of example, a reference is made here to FIG. 20 which shows a plan view of a typical insulated gate type field effect transistor constituting the above stated peripheral circuits, as well as to FIGS. 21 and 22 showing sections taken along the line A—A and line B—B of FIG. 20, respectively. In these Figures, the members and parts similar to those of the foregoing embodiment are denoted by the same reference numerals for an easier understanding. In this regard, each of 31', 31" and 31"' are contact windows, in PSG film 27, for connections to drain and source regions 29' and 30', and to second polysilicon layer 26', respectively; and 28"' is a wiring layer for connecting through contact window 31"' to second polysilicon layer 26'.

As will be seen from these Figures, as well as from the later-mentioned detailed illustration of the process, the first gate electrode of a MOS transistor constituting a part of the peripheral circuits other than the memory mats is inconveniently formed in a floating state, if the MOS transistor is formed in the same process as the memory cells. Therefore, in order to ensure the direct contact of the second polysilicon layer 26 with the first polysilicon layer 24, the desired portion of the insulating interlayer 25 has been selectively removed immediately before the formation of the second polysilicon layer 26. The polysilicon layer 26" found on the thick field oxide layer 22 in FIGS. 20 and 21 is formed during the formation of the second polysilicon layer 26, and can be made use of as a wiring layer, constituting a so-called cross wiring which is separated from other Al wiring layers 28".

Sections taken along the lines A—A and B—B of FIG. 20 are shown by FIGS. 23 to 28 and FIGS. 29 to 34, respectively, in each step of the manufacturing process. These steps are not detailed here, because they are obviously understood from the description of the foregoing embodiment taken in relation with FIGS. 4 thru 16, except for the following characteristic features.

Namely, as will be seen from FIGS. 25, 26 and FIGS. 31, 32, the thick field oxide layer 22 is formed by oxidizing the substrate surface making use of the insulating layer 25 of silicon nitride film as the mask, as is in the foregoing embodiment. For removing the parts of the insulating layer 25 corresponding to the peripheral circuits, an etching is performed making use of a mask covering the area occupied by the memory cell mats 41, 42, 43, 44, whose pattern is shown in FIG. 19 in plan, so that the first polysilicon layer 24 may be exposed at its portions corresponding to the area on which the peripheral circuits are to be formed. Then, after removing the mask, the second polysilicon layer 26 is deposited over the entire area including the insulating layer 25 left on the memory cell mats, exposed portion 24' of the first polysilicon layer 24 and the field oxide layer 22.

It will be seen that the first polysilicon layer of the MOS transistors in the peripheral circuits can be connected to the second polysilicon layer, by simply adding a step of removing the other portion of the insulating layer 25 than that covering the memory cell mats.

Figure 27:
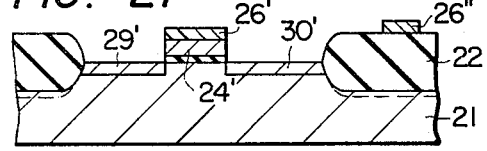
Figure 28:
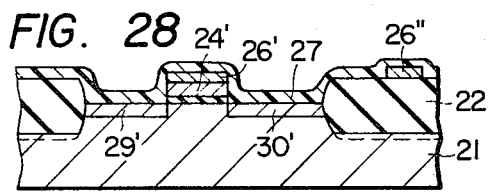
Figure 29:
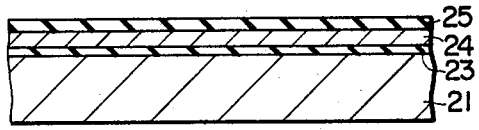
Figure 30:
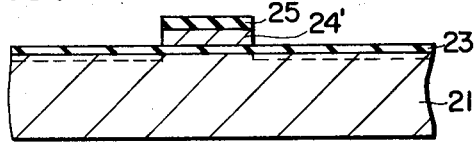
Figure 31:
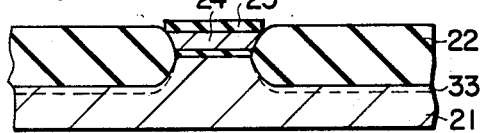
Figure 32:
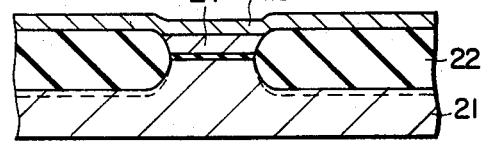
Figure 33:
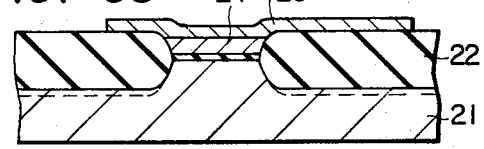
Figure 34:

In addition, as will be seen from FIG. 27, the drain and the source regions 29' and 30' of the transistors of the peripheral circuits are formed, as is in the foregoing embodiment, in self-alignment with the second and the first polysilicon layers 26', 24'. Therefore, it is possible to form the transistors of the peripheral circuits simultaneously with the transistors of the memory cells.

It will be understood from the foregoing description that not only the area occupied by the memory cell mat, but the area occupied by the peripheral circuits as well can be remarkably diminished, according to the construction of transistor and the method of producing the same in accordance with the present invention.

Having described the invention through preferred embodiments, it is to be noted here that these embodiments are not exclusive, and various changes and modifications may be imparted thereto without departing from the scope of the invention.

What is claimed is:

1. A method of manufacturing a nonvolatile semiconductor memory device comprising the steps of: forming a first semiconductive layer on a first insulating film covering a surface of a semiconductive substrate; forming a second insulating film, serving as a mask for oxidation, so as to cover said first semiconductive layer; selectively removing in a self-aligned manner portions of said second insulating film and said first semiconductive layer so as to provide a first strip of the remaining portions of the second insulating film and first semiconductive layer extending in a direction; oxidizing the surface of said substrate by using the remaining portions of the second insulating film as a mask for the oxidation so as to form a field insulator on areas of the substrate not covered with the remaining portion of the second insulating film on both sides of said strip, the field insulator being self-aligned with the strip; forming a second semiconductive layer over said second insulating film and said field insulator; selectively removing said second semiconductive layer so as to provide a second strip of the remaining portion of the second semiconductive layer extending transversely with respect to said first strip, and selectively removing portions of the first strip so as to form a floating gate of the remaining part of the first semiconductive layer self-aligned with the second strip; and introducing impurities of a conductivity type opposite to the conductivity type of the substrate into areas of the substrate not covered with the field insulator and second strip, so as to form source and drain regions self-aligned with the second strip and floating gate.

2. A method according to claim 1, wherein said first and second semiconductive layers are comprised of polysilicon, while said second insulating film is comprised of a layer containing silicon nitride.

3. The method of claim 2, wherein the thickness of the first semiconductive layer is 0.1 to 0.4 microns.

4. The method of claim 3, wherein the thickness of the first semiconductive layer is 0.1 to 0.2 microns.

5. A method according to claim 1, wherein said second insulating film is comprised of a silicon nitride film sandwiched by silicon oxide films.

6. The method of claim 5, wherein the silicon oxide film of said second insulating film closest to the first semiconductive layer has a thickness of 0.01 to 0.1 micron.

7. The method of claim 6, wherein the thickness of the other silicon oxide film of the second insulating film is 200 to 500 Å.

8. A method of manufacturing a storage transistor comprising:
(a) forming a first insulating layer over a surface of a semiconductor substrate having a first conductivity type;
(b) forming a first conductive layer on the first insulating layer;
(c) forming a second insulating layer over the first conductive layer;
(d) selectively etched said second insulating layer and first conductive layer in a self-aligned manner so that the remaining portions of the second insulating layer and first conductive layer are formed in the shape of a first strip extending in a first direction;
(e) oxidizing the surface of said semiconductor substrate not having the remaining portions thereon by using the resultant second insulating layer as a mask for the oxidation so as to form a field oxide layer on areas of said surface uncovered with said first strip, whereby said field oxide layer is formed in self-alignment with said first conductive layer;
(f) forming a second conductive layer over the second insulating layer of said first strip;
(g) selectively etching said second conductive layer in the shape of a second strip extending in a second direction different than said first direction and serving as a control gate, and selectively etching portions of said first strip not covered by said second strip so as to form a floating gate of the remaining first conductive layer self-aligned with said second strip; and
(h) introducing impurities of a conductivity type opposite to the conductivity type of the semiconductor substrate into areas of said semiconductor substrate not covered with said field oxide layer and second strip so as to form source and drain regions self-aligned with the second strip and floating gate.

9. The method of claim 8, wherein the second insulating layer contains silicon nitride.

10. The method of claim 8, wherein the first and second conductive layers are comprised of polysilicon, and that the second insulating layer contains a silicon nitride film sandwiched by two silicon oxide films.

11. The method of claim 10, wherein the thickness of the first conductive layer is 0.1 to 0.4 microns.

12. The method of claim 11, wherein the thickness of the first conductive layer is 0.1 to 0.2 microns.

13. The method of claim 10, wherein the silicon oxide film of said second insulating film closest to the first conductive layer has a thickness of 0.01 to 0.1 micron.

14. The method of claim 13, wherein the thickness of the other silicon oxide film of the second insulating film is 200 to 500 Å.

15. The method of claim 8, wherein the second direction, in which the second strip extends, is perpendicular to said first direction.

16. The method of claim 8, further comprising forming a semiconductive region of the same conductivity type as the semiconductive substrate and a conductivity higher than said semiconductor substrate to lie under said field oxide layer, to prevent generation of a parasitic channel on the surface of the substrate attributable to application of voltage to the second conductive layer.

17. A method of making an electrically programmable non-volatile semiconductor memory device in the form of an array of rows and columns of memory cells comprising the steps of:
  applying, over a first insulating layer formed on a main surface of a semiconductor substrate, successive coatings of a first conductive layer and a second insulating layer;
  patterning said coatings to provide a plurality of first parallel strips, the patterned second insulating layer and first conductive layer of each first strip being self-aligned with each other;
  oxidizing portions of said main surface by using said patterned second insulating layer as a mask to form field oxide layers between said parallel strips, whereby the field oxide layers are formed self-aligned with said patterned first conductive layer;
  forming a second conductive layer over said main surface;
  patterning said second conductive layer to provide a plurality of second parallel strips extending transversely with respect to said first strips, and selectively removing portions of said first conductive layer of each first strip except for the remaining portions located at the intersections of said first strips and said second strips to provide a floating gate of the memory cell self-aligned with said second strip at each intersection; and
  introducing impurities of a conductivity type opposite to said semiconductor substrate into areas of said semiconductor substrate not covered by said field oxide layers and second strips, thereby to form source and drain regions of the memory cell self-aligned with said second strip and floating gate on both sides of each floating gate.

18. A method according to claim 17, wherein said first and second conductive layers are of polysilicon, and said second insulating layer is of silicon nitride.

19. A method according to claim 17, further comprising a step of forming an insulating layer over said main surface immediately before the step of forming said second conductive layer.

20. The method of claim 17, wherein a plurality of the arrays of rows and columns of memory cells are formed on the main surface of the semiconductor substrate.

21. The method of claim 20, wherein peripheral circuits, electrically connected to said plurality of arrays, are formed on said main surface of the semiconductor substrate simultaneously with the forming of the plurality of arrays.

22. The method of claim 21, wherein the peripheral circuits include an MOS transistor, having a first gate electrode, said first gate electrode being formed simultaneously with the forming of the plurality of arrays by performing said applying successive coatings of a first conductive layer and a second insulating layer and performing said forming a second conductive layer over said main surface, including at a position at which said first gate electrode is to be formed; and before said forming a second conductive layer, performing the step of removing the second insulating layer at the position at which said first gate electrode is to be formed, whereby the second conductive layer is formed in direct electrical contact with the first conductive layer so that the first gate electrode is not formed in the floating state.

23. The method of claim 22, wherein said step of removing the second insulating layer at the position at which said first gate electrode is to be formed is performed after said oxidizing portions of said main surface to form field oxide layers.

* * * * *